United States Patent
Perzlmaier et al.

(10) Patent No.: US 9,577,165 B2
(45) Date of Patent: Feb. 21, 2017

(54) LIGHT EMITTING DIODE CHIP

(75) Inventors: Korbinian Perzlmaier, Regensburg (DE); Kai Gehrke, Regensburg (DE); Robert Walter, Parsberg (DE); Karl Engl, Pentling (DE); Guido Weiss, Regensburg (DE); Markus Maute, Alteglofsheim (DE); Stefanie Rammelsberger, Zeitlarn (DE)

(73) Assignee: OSRAM Opto Semiconductor GmbH (DE)

( * ) Notice: Subject to any disclaimer, the term of this patent is extended or adjusted under 35 U.S.C. 154(b) by 219 days.

(21) Appl. No.: 14/240,443

(22) PCT Filed: Aug. 23, 2012

(86) PCT No.: PCT/EP2012/066462
§ 371 (c)(1),
(2), (4) Date: Apr. 16, 2014

(87) PCT Pub. No.: WO2013/030094
PCT Pub. Date: Mar. 7, 2013

(65) Prior Publication Data
US 2014/0319566 A1    Oct. 30, 2014

(30) Foreign Application Priority Data
Aug. 31, 2011    (DE) .................. 10 2011 112 000

(51) Int. Cl.
*H01L 33/60* (2010.01)
*H01L 33/40* (2010.01)
(Continued)

(52) U.S. Cl.
CPC ............ *H01L 33/60* (2013.01); *H01L 33/405* (2013.01); *H01L 33/42* (2013.01); *H01L 33/56* (2013.01);
(Continued)

(58) Field of Classification Search
CPC ...... H01L 33/60; H01L 33/382; H01L 33/405; H01L 33/42
(Continued)

(56) References Cited

U.S. PATENT DOCUMENTS 7,259,402 B2    8/2007  Edmond et al.
7,646,036 B2    1/2010  Kozawa et al.
(Continued)

FOREIGN PATENT DOCUMENTS

CN    1426603    6/2003
CN    1557025    12/2004
(Continued)

OTHER PUBLICATIONS

English Translation of the Jul. 3, 2014 Office Action and Search Report from related Chinese Application No. 201180011835.1.
(Continued)

*Primary Examiner* — William F Kraig
*Assistant Examiner* — Pavel Ivanov
(74) *Attorney, Agent, or Firm* — DLA Piper LLP (US)

(57) ABSTRACT

A light emitting diode chip includes a semiconductor layer sequence having an active layer that generates electromagnetic radiation, wherein the light emitting diode chip has a radiation exit area at a front side, the light emitting diode chip has a mirror layer at least in regions at a rear side situated opposite the radiation exit area, said mirror layer containing silver, a protective layer is arranged on the mirror layer, and the protective layer comprises a transparent conductive oxide.

11 Claims, 1 Drawing Sheet

(51) Int. Cl.
*H01L 33/42* (2010.01)
*H01L 33/56* (2010.01)
*H01L 33/38* (2010.01)

(52) U.S. Cl.
CPC ...... *H01L 33/382* (2013.01); *H01L 2924/0002* (2013.01)

(58) Field of Classification Search
USPC .......................................................... 257/98
See application file for complete search history.

(56) References Cited

U.S. PATENT DOCUMENTS

| | | | |
|---|---|---|---|
| 7,859,109 | B2 | 12/2010 | Lee |
| 8,643,195 | B2 | 2/2014 | Slater |
| 2003/0015721 | A1 | 1/2003 | Slater, Jr. et al. |
| 2003/0164503 | A1 | 9/2003 | Chen |
| 2006/0033113 | A1 | 2/2006 | Lee et al. |
| 2006/0060877 | A1 | 3/2006 | Edmond et al. |
| 2008/0003777 | A1 | 1/2008 | Slater et al. |
| 2008/0185609 | A1 | 8/2008 | Kozawa et al. |
| 2009/0250713 | A1 | 10/2009 | Choy et al. |
| 2010/0041170 | A1* | 2/2010 | Epler ................... H01L 33/0079 438/26 |
| 2010/0171094 | A1 | 7/2010 | Lu et al. |
| 2010/0171135 | A1 | 7/2010 | Engl et al. |
| 2011/0233581 | A1* | 9/2011 | Sills ........................ H01L 33/06 257/98 |
| 2011/0260205 | A1* | 10/2011 | Moosburger ............ H01L 27/15 257/99 |
| 2011/0303934 | A1* | 12/2011 | Kang .................... H01L 33/405 257/98 |

FOREIGN PATENT DOCUMENTS

| | | |
|---|---|---|
| CN | 1582503 | 2/2005 |
| CN | 1734796 | 2/2006 |
| DE | 102007022947 | 10/2008 |
| DE | 102009033686 | 1/2011 |
| DE | 102010024079 | 12/2011 |
| JP | 2004-260178 | 9/2004 |
| JP | 2005-209734 | 8/2005 |
| JP | 2006-024750 | 1/2006 |
| JP | 2007-287912 | 11/2007 |
| JP | 2008-053685 | 3/2008 |
| JP | 2008-103674 | 5/2008 |
| JP | 2009-49266 | 3/2009 |
| JP | 2010-27643 | 2/2010 |
| TW | 201014000 | 4/2010 |
| WO | 2005/069389 | 7/2005 |
| WO | 2008/131735 | 6/2008 |
| WO | WO 2009091194 A2 * | 7/2009 ........... H01L 33/405 |
| WO | 2010/060404 | 6/2010 |
| WO | 2011/006719 | 1/2011 |
| WO | 2011/157523 | 12/2011 |

OTHER PUBLICATIONS

English translation of the Chinese First Office Action dated Nov. 6, 2015 of corresponding Chinese Application No. 201280042389.5.
English translation of corresponding Notice of Reasons for Rejection of JP Application No. 2012-555354 dated Dec. 24, 2014.
US Official Action dated Mar. 28, 2014 from related U.S. Appl. No. 13/581,417.
Corresponding Examination Report of Taiwanese Application No. 104-2(1)04305-10420326490 dated Mar. 16, 2015 along with an English translation.
English translation of the Notification of Reasons for Refusal of corresponding Japanese Application No. 2014-527595 dated Mar. 30, 2015.
German translation of a Second Office Action dated Aug. 18, 2016, of corresponding Chinese Application No. 201280042389.5, along with a partial English translation.

* cited by examiner

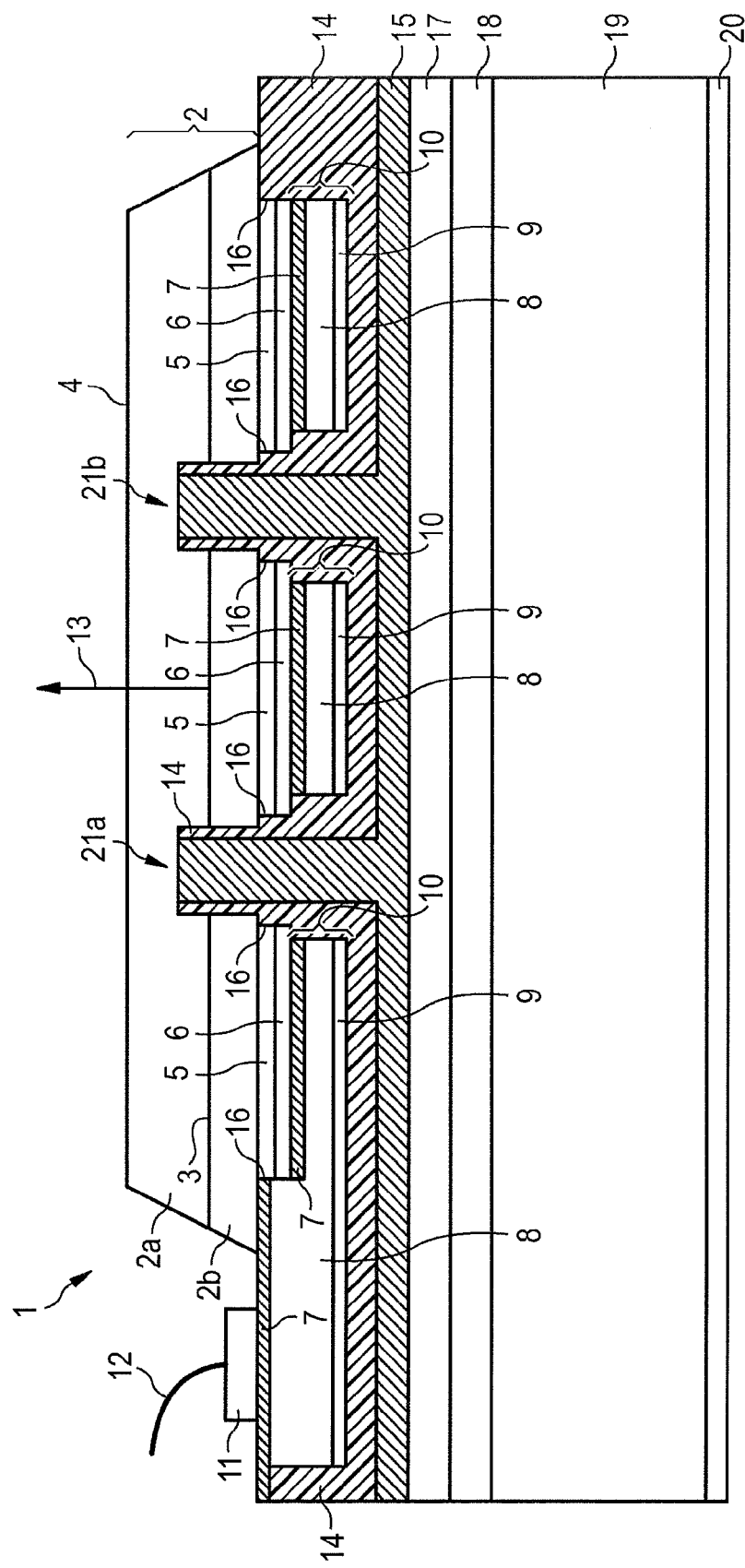

LIGHT EMITTING DIODE CHIP

TECHNICAL FIELD

This disclosure relates to a light emitting diode chip.

WO 2008/131735 A1 discloses a light emitting diode chip wherein a first and second electrical connection layer are arranged at a rear side of the light emitting diode chip situated opposite the radiation exit area and are electrically insulated from one another by a separating layer, wherein a partial region of the second electrical connection layer extends from the rear side through a perforation of the active layer in the direction toward the front side of the light emitting diode chip. Making contact with a semiconductor chip in this way has the advantage that the radiation exit area can be free of contact areas and, consequently, the emitted radiation is not shaded.

The light emitting diode chip is a so-called "thin-film" light emitting diode chip, wherein the original growth substrate of the semiconductor layer sequence is detached and, instead, the semiconductor layer sequence connects to a carrier by a solder layer at an opposite side relative to the original growth substrate. In the case of a thin-film light emitting diode chip of this type, it is advantageous if that side of the semiconductor layer sequence facing the carrier is provided with a mirror layer to deflect radiation emitted in the direction of the carrier in the direction of the radiation exit area and thereby to increase radiation efficiency.

For the visible spectral range, silver, in particular, is suitable as a material for the mirror layer. Silver is distinguished by a high reflection in the visible spectral range and produces a good electrical contact to the semiconductor material. On the other hand, however, silver is susceptible to corrosion and migration of the silver into adjacent layers can occur.

To protect a mirror layer composed of silver against corrosion, generally a protective layer is applied to the silver layer. By way of example, a platinum layer is suitable as a protective layer. However, it has been found that the platinum can penetrate into the silver layer at the process temperatures customary for applying the layers and can even pass as far as the opposite interface between the mirror layer and the semiconductor layer. The reflection of the interface between the mirror layer and the semiconductor layer sequence can be impaired as a result. This has the consequence that the light coupling-out and thus the efficiency of the light emitting diode chip are reduced. Furthermore, the electrical properties can also change as a result of the diffusion of platinum to the interface between the semiconductor layer sequence and the mirror layer.

It could therefore be helpful to provide a light emitting diode chip comprising a rear-side mirror layer protected against corrosion by a protective layer, wherein the reflection and electrical properties of the interface between the silver layer and the semiconductor layer sequence are not impaired.

SUMMARY

We provide a light emitting diode chip including a semiconductor layer sequence having an active layer that generates electromagnetic radiation, wherein the light emitting diode chip has a radiation exit area at a front side, the light emitting diode chip has a mirror layer at least in regions at a rear side situated opposite the radiation exit area, said mirror layer containing silver, a protective layer is arranged on the mirror layer, and the protective layer comprises a transparent conductive oxide.

We also provide a light emitting diode chip including a semiconductor layer sequence having an active layer that generates electromagnetic radiation, wherein the light emitting diode chip has a radiation exit area at a front side, the light emitting diode chip has a mirror layer at least in regions at a rear side situated opposite the radiation exit area, said mirror layer containing silver, a protective layer is arranged on the mirror layer, the protective layer comprises a transparent conductive oxide, and the mirror layer adjoins the semiconductor layer sequence at an interface situated opposite the protective layer.

BRIEF DESCRIPTION OF THE DRAWING

FIG. 1 shows a schematic illustration of a cross section through a light emitting diode chip in accordance with one example.

DETAILED DESCRIPTION

The light emitting diode chip may contain a semiconductor layer sequence having an active layer that generates electromagnetic radiation. The light emitting diode chip has a radiation exit area at a front side, through which radiation exit area the electromagnetic radiation emitted by the active layer emerges from the semiconductor layer sequence. The front side of the light emitting diode chip is understood here and hereinafter to be that side of the light emitting diode chip at which the radiation exit area is arranged.

At a rear side situated opposite the radiation exit area, the light emitting diode chip has a mirror layer at least in regions, the mirror layer containing silver or preferably consisting of silver.

A protective layer that reduces corrosion of the mirror layer is arranged on the mirror layer. The protective layer advantageously contains a transparent conductive oxide (TCO) or consists thereof. We found that a transparent conductive oxide is particularly well suited to protect the mirror layer against environmental influences and/or diffusion of constituents of adjacent layers, wherein the material of the transparent conductive oxide does not diffuse into the mirror layer and, in particular, does not diffuse through the mirror layer as far as an interface—situated opposite the protective layer—between the mirror layer and semiconductor layer sequence. Therefore, the mirror layer advantageously contains no material of the protective layer.

The optical and electrical properties of the interface between the mirror layer and the semiconductor layer sequence are therefore not impaired by diffusion of material of the protective layer as far as the interface. In particular, the high reflection at the interface between the mirror layer composed of silver and the semiconductor layer sequence is not reduced.

The protective layer composed of the transparent conductive oxide advantageously also prevents diffusion of the silver from the mirror layer into layers which succeed the protective layer at the rear side of the light emitting diode chip such as an electrical contact layer, for example.

The material of the transparent conductive oxide can advantageously be selected and/or controlled with regard to a high electrical conductivity. This is based on the fact that the protective layer is advantageously arranged on a side of the mirror layer facing away from the semiconductor layer sequence and, consequently, is not situated in the beam path of the light emitting diode chip. For this reason, it is not necessary for the material of the transparent conductive oxide to have a high transparency. In particular, conductivity of the transparent conductive oxide can be improved by addition of a dopant.

An interface of the mirror layer situated opposite the protective layer preferably adjoins the semiconductor layer sequence. Therefore, between the semiconductor layer sequence and the mirror layer there is arranged, in particular, no intermediate layer such as an adhesion promoter layer, for example, which might result in a reduction of the reflection at the interface between the mirror layer and the semiconductor layer sequence. The mirror layer can adjoin, in particular, a p-type semiconductor region of the semiconductor layer sequence.

Preferably, the transparent conductive oxide comprises a zinc oxide (ZnO) or particularly preferably a doped zinc oxide, for example, ZnO:Al or ZnO:Ga. Further preferably, the transparent conductive oxide is an indium tin oxide (ITO), indium zinc oxide (IZO) or indium gallium zinc oxide (IGZO). These transparent conductive oxides are distinguished, in particular, by a good electrical conductivity.

The protective layer preferably has a thickness of 5 nm to 500 nm, particularly preferably 10 nm to 100 nm.

Preferably, the side flanks of the mirror layer and/or of the protective layer are covered by an electrically insulating layer. The electrically insulating layer electrically insulates the side flanks of the mirror layer and of the protective layer from layers adjacent in a lateral direction. Furthermore, the electrically insulating layer protects, in particular, the side flanks of the mirror layer against corrosion.

The electrically insulating layer can comprise, for example a silicon oxide, a silicon nitride or a silicon oxynitride. The electrically insulating layer is particularly preferably a $SiO_2$ layer.

Further preferably, a first electrical connection layer is arranged at an opposite side of the protective layer relative to the mirror layer. The first electrical connection layer is preferably formed from at least one material having good electrical conductivity to impress the current as uniformly as possible into the semiconductor layer sequence. Consequently, the first electrical connection layer also functions as a current spreading layer. The first electrical connection layer electrically conductively connects to one of the electrical contacts of the light emitting diode chip.

The first electrical connection layer is preferably formed from a plurality of partial layers, wherein the partial layers advantageously comprise, proceeding from the mirror layer, a platinum layer, a gold layer and a titanium layer. In this case, the partial layer composed of platinum advantageously functions as a diffusion barrier preventing the diffusion of constituents of succeeding layers into the protective layer or even into the mirror layer, and vice versa. The partial layer composed of gold functions as a current spreading layer on account of the high electrical conductivity, and the succeeding titanium layer functions as an adhesion promoter layer for further succeeding layers.

The light emitting diode chip preferably connects to a carrier at an opposite side relative to the semiconductor layer sequence as viewed from the mirror layer. The carrier is, in particular, a substrate different than a growth substrate of the semiconductor layer sequence and connected to the semiconductor layer sequence by a solder layer, for example.

A growth substrate used for the epitaxial growth of the semiconductor layer sequence is preferably detached from the light emitting diode chip. Therefore, the light emitting diode chip preferably has no growth substrate. By virtue of the fact that the growth substrate is detached from the light emitting diode chip and the radiation emitted in the direction of the carrier is reflected toward the radiation coupling-out area by the mirror layer, a light emitting diode chip having a high efficiency is obtained.

Preferably, the light emitting diode chip has a first and a second electrical connection layer, wherein the first and second electrical connection layers face the rear side of the semiconductor layer sequence and are electrically insulated from one another by an electrically insulating layer, wherein a partial region of the second electrical connection layer extends from the rear side of the semiconductor layer sequence through at least one perforation of the active layer in the direction toward the front side. In this configuration, therefore, both electrical connection layers are advantageously arranged at the rear side of the light emitting diode chip. This has the advantage, in particular, that a radiation exit area of the light emitting diode chip can be free of connection contacts. The electrically insulating layer electrically insulating the first and second connection layers from one another can cover the side flanks of the mirror layer and/or of the protective layer and in this way also protects the layers against external influences. The electrically insulating layer advantageously comprises an oxide or nitride such as, for example, a silicon oxide, a silicon nitride or a silicon oxynitride.

Our chips are explained in greater detail below on the basis of an example in connection with FIG. 1.

The constituent parts illustrated and also the size relationships of the constituent parts among one another should not be regarded as true to scale.

The light emitting diode chip 1 illustrated in FIG. 1 has a semiconductor layer sequence 2 having an active layer 3 that emits electromagnetic radiation 13.

The active layer 3 of the light emitting diode chip 1 can be, for example, a pn-junction, a double heterostructure, a single quantum well structure or multiple quantum well structure. In this case, the designation quantum well structure encompasses any structure in which charge carriers experience a quantization of their energy states as a result of confinement. In particular, the designation quantum well structure does not include any indication about the dimensionality of the quantization. It therefore encompasses, inter alia, quantum wells, quantum wires and quantum dots and any combination of these structures.

The semiconductor layer sequence 2, can, in particular, be based on a nitride compound semiconductor. In this context, "based on a nitride compound semiconductor" means that the semiconductor layer sequence 2 or at least one layer thereof comprises a III nitride compound semiconductor material, preferably $In_xAl_yGa_{1-x-y}N$, where $0 \le x \le 1$, $0 \le y \le 1$ and $x+y \le 1$. In this case, this material need not necessarily have a mathematically exact composition according to the above formula. Rather, it can comprise one or more dopants and additional constituents which substantially do not change the characteristic physical properties of the $In_xAl_yGa_{1-x-y}N$ material. For the sake of simplicity, however, the above formula only includes the essential constituents of the crystal lattice (In, Al, Ga, N), even if these can be replaced in part by small amounts of further substances.

The light emitting diode chip 1 emits electromagnetic radiation 13 through a radiation exit area 4 arranged at the front side of the light emitting diode chip 1. The radiation exit area 4 can be provided with a roughening or a coupling-out structure (not illustrated) to improve radiation coupling-out.

The light emitting diode chip 1 is a thin-film light emitting diode chip. In the thin-film light emitting diode chip, the original growth substrate of the semiconductor layer sequence 2 has been detached from the light emitting diode chip 1 and, instead, the light emitting diode chip 1 has been connected to a carrier 19 by a solder layer 18 at an opposite side relative to the original growth substrate. The original growth substrate may have been detached, in particular, from that surface of the semiconductor layer sequence 2 which now functions as the radiation exit area 4. In the light emitting diode chip 1, therefore, an n-type semiconductor region 2a usually first grown onto the growth substrate faces the radiation exit area 4. A p-type semiconductor region 2 of the semiconductor layer sequence 2 faces the carrier 19. The carrier 19 can comprise germanium or silicon, for example.

The light emitting diode chip 1 has a mirror layer 5 in regions at a rear side situated opposite the radiation exit area 4 to improve the efficiency of the light emitting diode chip 1. The mirror layer 5 is arranged between the p-type semiconductor region 2b and a first electrical connection layer 10 of the light emitting diode chip. Radiation emitted by the active layer 3 in the direction of the carrier 19 is advantageously reflected toward the radiation exit area 4 by the mirror layer 5.

The mirror layer 5 advantageously contains silver or consists thereof. A mirror layer 5 composed of silver advantageously has a high reflection in the visible spectral range. Furthermore, silver is distinguished by a high electrical conductivity. The mirror layer 5 can adjoin the p-type semiconductor region 2b, in particular, and in this way form one of the electrical connections of the semiconductor layer sequence 2 of the light emitting diode chip 1.

In the case of a mirror layer 5 composed of silver, the problem can occur that the layer is comparatively susceptible to corrosion, which might result in a reduction of the radiation efficiency particularly after a long operating duration of the light emitting diode chip 1. To protect the mirror layer 5 against corrosion and prevent diffusion of material of the mirror layer 5 into succeeding layers 7, 8, 9, and vice versa, a protective layer 6 is arranged on the interface of the mirror layer 5 facing away from the semiconductor layer sequence 2.

The protective layer 6 advantageously comprises a transparent conductive oxide. Preferably, the protective layer 6 contains ZnO, ZnO:Ga, ZnO:Al, ITO, IZO or IGZO or consists thereof In comparison with a metallic protective layer such as platinum or titanium, for example, the protective layer 6 composed of the transparent conductive oxide has the advantage that the material of the protective layer 6 does not diffuse into the mirror layer 5.

Consequently, the material of the protective layer 6, in particular, does not reach the interface—situated opposite the protective layer 6—between the semiconductor layer sequence 2 and the mirror layer 5. A reduction—caused by diffusion of material of the protective layer 6 into the mirror layer 5—of the reflection and/or a change in the electrical properties, in particular the forward voltage, therefore advantageously do(es) not occur. Furthermore, the protective layer 6 advantageously also prevents diffusion of the silver from the mirror layer 5 into succeeding layers 7, 8, 9 and diffusion of material of the succeeding layers 7, 8, 9, in particular a metal such as gold, for example, into the mirror layer 5.

The protective layer 6 advantageously has a thickness of 5 nm to 500 nm, particularly preferably 10 nm to 100 nm.

At an interface situated opposite the mirror layer 5, the protective layer 6 adjoins the first electrical connection layer 10. The first electrical connection layer 10 can have a plurality of partial layers 7, 8, 9. By way of example, the first electrical connection layer 10 has three partial layers. Proceeding from the protective layer 6, the partial layers are preferably a platinum layer 7, a gold layer 8 and a titanium layer 9. The platinum layer 7 has, in particular, the function of a diffusion barrier which prevents the diffusion of constituents of the succeeding layers 8, 9 into the protective layer 6, or even into the mirror layer 5, and vice versa. The gold layer 8 functions as a current spreading layer on account of the high electrical conductivity, and the succeeding titanium layer 9 functions as an adhesion promoter layer for further succeeding layers, in particular an electrically insulating layer 14.

The light emitting diode chip 1 additionally has a second electrical connection layer 15, by which contact is made with the light emitting diode chip 1 from a rear side situated opposite the radiation exit area 4. Therefore, both the first electrical connection layer 10 and the second electrical connection layer 15 are arranged at a rear side of the light emitting diode chip 1 facing the carrier 19. This has the advantage that the radiation exit area 4 is free of electrical connection layers such that the electromagnetic radiation 13 emitted by the light emitting diode chip 1 is not shaded by one of the electrical connection layers 10, 15.

The first electrical connection layer 10 preferably makes contact with the p-type region 2b of the semiconductor layer sequence 2. The second electrical connection layer 15 preferably makes contact with the n-type region 2a of the semiconductor layer sequence 2. For this purpose, the second electrical connection layer 15 is led from the rear side of the light emitting diode chip 1 through one or more perforations 21a, 21b extending through the p-type region 2b of the semiconductor layer sequence and the active layer 3, right into the n-type region 2a of the semiconductor layer sequence 2. The second electrical connection layer 15 is electrically insulated from the active layer 3 and the p-type region 2b of the semiconductor layer sequence 2 in the region of the perforations 21a, 21b by an electrically insulating layer 14 to prevent a short circuit.

Furthermore, the electrically insulating layer 14 also insulates the second electrical connection layer 15 from the first electrical connection layer 10. The electrically insulating layer 14 is, for example, an oxide or nitride layer, preferably a silicon oxide layer, a silicon nitride layer or a silicon oxynitride layer.

The electrically insulating layer 14 advantageously covers, at least in partial regions, the side flanks 16 of the mirror layer 5 and of the protective layer 6. In this way, the mirror layer 5 is advantageously also protected against corrosion at the side flanks 16.

The second electrical connection layer 15 preferably contains silver and functions, in particular in the region of the perforations 21a, 21b, as a second mirror layer for the electromagnetic radiation 13 emitted by the light emitting diode chip 1.

A diffusion barrier layer 17 is preferably arranged between the second electrical connection layer 15 and the solder layer 18. The diffusion barrier layer 17 prevents a constituent of the solder layer 18 from diffusing into the second electrical connection layer 15, and vice versa. The diffusion barrier layer 17 contains titanium tungsten nitride, for example.

The light emitting diode chip 1 is soldered onto the carrier 19 by the solder layer 18. The solder layer 18 can contain AuSn, in particular.

The carrier 19 of the light emitting diode chip 1 can be, for example, a germanium or silicon carrier. A contact metallization 20 can be applied at the rear side of the carrier facing away from the light emitting diode chip 1, via which contact metallization the second electrical connection layer 15 is electrically connected toward the outside.

The first electrical connection layer 10 can be electrically connected toward the outside, for example, via a bonding pad 11 and a bonding wire 12.

Our chips are not restricted by the description on the basis of the examples. Rather, this disclosure encompasses any novel feature and also any combination of features, which in particular includes any combination of features in the appended claims, even if the feature or combination itself is not explicitly specified in the claims or examples.

The invention claimed is:

1. A light emitting diode chip comprising a semiconductor layer sequence having an active layer that generates electromagnetic radiation, wherein
    the light emitting diode chip has a radiation exit area at a front side,
    the light emitting diode chip has a mirror layer at least in regions at a rear side situated opposite the radiation exit area relative to the active layer, said mirror layer containing silver,
    a protective layer is arranged on the mirror layer,
    the protective layer comprises a transparent conductive oxide,
    a first electrical connection layer is arranged at an opposite side of the protective layer relative to the mirror layer,
    the first electrical connection layer is formed from a plurality of partial layers, and
    the plurality of partial layers comprise, proceeding from the minor layer, a platinum layer, a gold layer and a titanium layer.

2. The light emitting diode chip according to claim 1, wherein the mirror layer adjoins the semiconductor layer sequence at an interface of the mirror layer situated opposite to the protective layer relative to the mirror layer.

3. The light emitting diode chip according to claim 1, wherein the protective layer comprises ZnO, ZnO:Ga, ZnO:Al, ITO, IZO or IGZO.

4. The light emitting diode chip according to claim 1, wherein the protective layer has a thickness of 5 nm to 500 nm.

5. The light emitting diode chip according to claim 4, wherein the protective layer has a thickness of 10 nm to 100 nm.

6. The light emitting diode chip according to claim 1, wherein side flanks of the mirror layer and/or of the protective layer are covered by an electrically insulating layer at least in regions.

7. The light emitting diode chip according to claim 6, wherein the electrically insulating layer is an oxide or nitride layer.

8. The light emitting diode chip according to claim 1, wherein the light emitting diode chip connects to a carrier, and the carrier is opposite of the semiconductor layer sequence relative to the mirror.

9. The light emitting diode chip according to claim 1, wherein the light emitting diode chip comprises no growth substrate.

10. The light emitting diode chip according to claim 1, wherein
    the light emitting diode chip comprises a first electrical connection layer and a second electrical connection layer,
    the first electrical connection layer and the second electrical connection layer face the rear side of the semiconductor layer sequence and are electrically insulated from one another by an electrically insulating layer, and
    a partial region of the second electrical connection layer extends from the rear side of the semiconductor layer sequence through at least one perforation of the active layer in a direction toward the front side.

11. The light emitting diode chip according to claim 1, wherein a region of the semiconductor layer sequence adjoins the mirror layer, and is a p-type semiconductor region.

* * * * *

UNITED STATES PATENT AND TRADEMARK OFFICE
CERTIFICATE OF CORRECTION

PATENT NO. : 9,577,165 B2  Page 1 of 1
APPLICATION NO. : 14/240443
DATED : February 21, 2017
INVENTOR(S) : Perzlmaier et al.

It is certified that error appears in the above-identified patent and that said Letters Patent is hereby corrected as shown below:

In the Claims

In Column 7, at Line 38, please change "minor" to --mirror--.

Signed and Sealed this
Ninth Day of May, 2017

Michelle K. Lee
*Director of the United States Patent and Trademark Office*